United States Patent
Berman et al.

(10) Patent No.: US 6,739,953 B1
(45) Date of Patent: May 25, 2004

(54) MECHANICAL STRESS FREE PROCESSING METHOD

(75) Inventors: Michael J. Berman, Portland, OR (US); Steven E. Reder, Boring, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/410,925

(22) Filed: Apr. 9, 2003

(51) Int. Cl.⁷ .................................................. B24B 1/00
(52) U.S. Cl. ............................. 451/41; 451/36; 451/41; 451/37; 451/60; 451/285; 451/287; 451/446; 451/908; 438/622; 438/631; 438/633; 438/647; 438/648
(58) Field of Search .............................. 451/36, 41, 37, 451/60, 285, 286, 287, 446, 908; 438/622, 631, 633, 647, 648

(56) References Cited

U.S. PATENT DOCUMENTS 6,096,648 A * 8/2000 Lopatin et al. ............. 438/687
6,242,343 B1 * 6/2001 Yamazaki et al. .......... 438/633
6,285,035 B1 * 9/2001 Taravade .................. 250/559.22
6,315,883 B1 * 11/2001 Mayer et al. ............... 205/123
6,368,190 B1 * 4/2002 Easter et al. ................ 451/41

* cited by examiner

Primary Examiner—Joseph J. Hail, III
Assistant Examiner—Shantese McDonald
(74) Attorney, Agent, or Firm—Beyer Weaver & Thomas, LLP

(57) ABSTRACT

According to one embodiment, a method of planarizing of a surface of a semiconductor substrate is provided. A copper layer is inlaid in a dielectric layer of the substrate. The semiconductor substrate is disposed opposite to a polishing pad and relative movement provided between the pad and the substrate. An electrolytic slurry containing abrasive particles is flowed over the substrate or the pad. A voltage is applied between the polishing pad and the substrate to perform electropolishing of the substrate. The rate of chemical mechanical polishing is controlled by the down force applied to a polishing head urging the substrate against the polishing pad.

20 Claims, 4 Drawing Sheets

MECHANICAL STRESS FREE PROCESSING METHOD

BACKGROUND OF THE INVENTION

1. Field of the Invention

The present invention relates to methods for performing polishing of semiconductor wafers. More particularly, the present invention relates to methods for mechanical stress free processing of damascene interconnects on semiconductor wafers during the manufacture of semiconductor integrated circuits.

2. Description of the Related Art

As integrated circuits become smaller, it becomes more desirable to reduce interconnection delays through the selection of materials used in the interconnects and associated dielectric layers. The propagation delays through the interconnects are proportional to the resistance of the interconnects and the capacitance offered by the dielectric. In fact, as integrated devices become smaller, the resistance capacitance (RC) delay time of signal propagation along interconnects becomes the dominant factor limiting overall chip speed. In order to improve the interconnect performance, higher conductance and lower capacitance is required of the interconnects. In order to accommodate these objectives, the trend has been towards the use of copper for interconnects and damascene methods for forming the interconnects.

For conductors, copper has gained favor in the industry because of its many advantages, including its low resistance. In such processes, conducting metal (e.g., copper) is inlaid into trench and via structures of insulating material (e.g., low-k dielectric materials). CMP (Chemical Mechanical Polishing) is used to remove conducting metal (e.g., copper) in single or dual damascene processes. With the advent of copper technology, resistance has been minimized and attention has been focused on reducing capacitance.

One method conventionally used to reduce capacitance is to reduce the average dielectric constant k of the thin insulating films surrounding interconnects through the introduction of porosity. The dielectric layers in conventional integrated circuits have traditionally been formed of $SiO_2$, which has a dielectric constant of about 4.0. A number of dielectric materials have been developed having a dielectric constant lower than that of $SiO_2$. These are generally referred to as low-k materials.

Integrated circuits are often made up of many interconnect levels to connect the various devices of the circuit. Low-k dielectric materials are used to electrically isolate the different levels of metallization. Thus, a semiconductor device may include several low-k layers disposed on top of each other.

But low-k materials used in interconnect dielectrics exhibit low mechanical strength. That is, the lack of mechanical rigidity of the composite low-k and metal interconnect materials causes delamination of the low-k to low-k layers and low-k to copper layers when shear forces are applied. The mechanical strength of low-k films is considerably less than that of traditional silicon dioxide. As the dielectric constants reach lower values, the structural integrity of the films decrease. This compromised mechanical strength of the low-k film significantly increases the likelihood of damage to the structure of the low-k copper dual damascene system during conventional chemical mechanical polishing (CMP). That is, while the wafers are subjected to chemical mechanical polishing (CMP), shear stresses and other mechanical damage may cause defects that render the devices useless.

This presents an ever-challenging task for CMP and developers of dielectric films. For example, CMP vendors are working on new pad materials and slurry solutions to optimize planarization with a much lower down force, but this approach has its limitations. But a reduction in down force will cause a major reduction in the removal rate of the copper.

Thus, the poor mechanical strength of the low-k material affects the ability to use chemical mechanical polishing to remove the copper film and planarize the wafer surface between copper layers.

Accordingly, it is desirable to provide improved methods of planarizing semiconductor wafer surfaces to minimize or eliminate damage to dielectric layers. In particular, it is desirable to provide more effective methods of planarizing surfaces in low-k damascene interconnect structures to avoid defects caused by shear stresses or other damage from conventional CMP procedures.

SUMMARY OF THE INVENTION

To achieve the foregoing, the present invention provides methods for processing semiconductor wafers using a combination of chemical mechanical polishing (CMP) and electropolishing. The processing sequence involves an initial light mechanical polish to planarize the copper metal layer followed by an electropolishing of the copper layer. The electropolishing proceeds until the copper layer is removed sufficiently to expose the barrier metal layer. The same electrolyte/slurry is used for both steps, the steps being distinguished by changing the down force applied to the wafer and the voltage applied across the polishing head and platen.

By processing the semiconductor wafer in this manner, a non-contact method of removing copper from the wafer is provided.

With these techniques, a copper damascene structure may be planarized and the excess metal removed by using the polishing head and platen as the respective anode and cathode for electropolishing. In this configuration, the polishing pad is conductive and acts as a pseudo polishing pad during the electropolishing. An electrolytic solution is maintained as a barrier layer on the polishing pad by suitably controlling the viscosity of the electrolytic slurry dispensed on the polishing pad, such as by controlling the temperature and additive concentration for the slurry.

According to one embodiment, a method of planarizing of a surface of a semiconductor substrate is provided. A copper layer is inlaid in a dielectric layer of the substrate. The semiconductor substrate is disposed opposite to a polishing pad and relative movement provided between the pad and the substrate. An electrolytic slurry containing abrasive particles is flowed over the substrate or the pad. A voltage is applied between the polishing pad and the substrate to perform electropolishing of the substrate.

These and other features and advantages of the present invention are described below with reference to the drawings.

DETAILED DESCRIPTION OF PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

To achieve the foregoing, the present invention provides methods for processing semiconductor wafers using a combination of chemical mechanical polishing (CMP) and electropolishing. The possessing sequence involves an initial light mechanical polish to planarize the copper metal layer followed by an electropolishing of the copper layer. The electropolishing proceeds until the copper layer is removed sufficiently to expose the barrier metal layer. The same electrolyte/slurry is used for both steps, the steps being distinguished by changing the down force applied to the wafer and the voltage applied across the polishing head and platen.

Chemical mechanical polishing removes material from uneven topography on a wafer surface to produce a planarized surface. The planarized surface is important for accurate photolithographic imaging of patterns for subsequent layers formed on the planarized surface since the lithography process depends on a consistent depth of focus. Conventional CMP processes are performed using a slurry, containing abrasive particles in a reactive solution with a conventional polishing pad. Typically, the polishing pad is made from a synthetic material.

In conventional CMP techniques, a substrate carrier or polishing head is mounted on a carrier assembly and positioned in contact with a polishing pad of a CMP apparatus. The carrier assembly provides a controllable pressure to the substrate and urges the substrate against the polishing pad. The pad is moved relative to the substrate by an external driving force. Thus, the CMP apparatus effects polishing or rubbing movement between the surface of the substrate and the polishing pad while dispersing a slurry to produce both chemical and mechanical material removal effects on the wafer.

Figure 1:
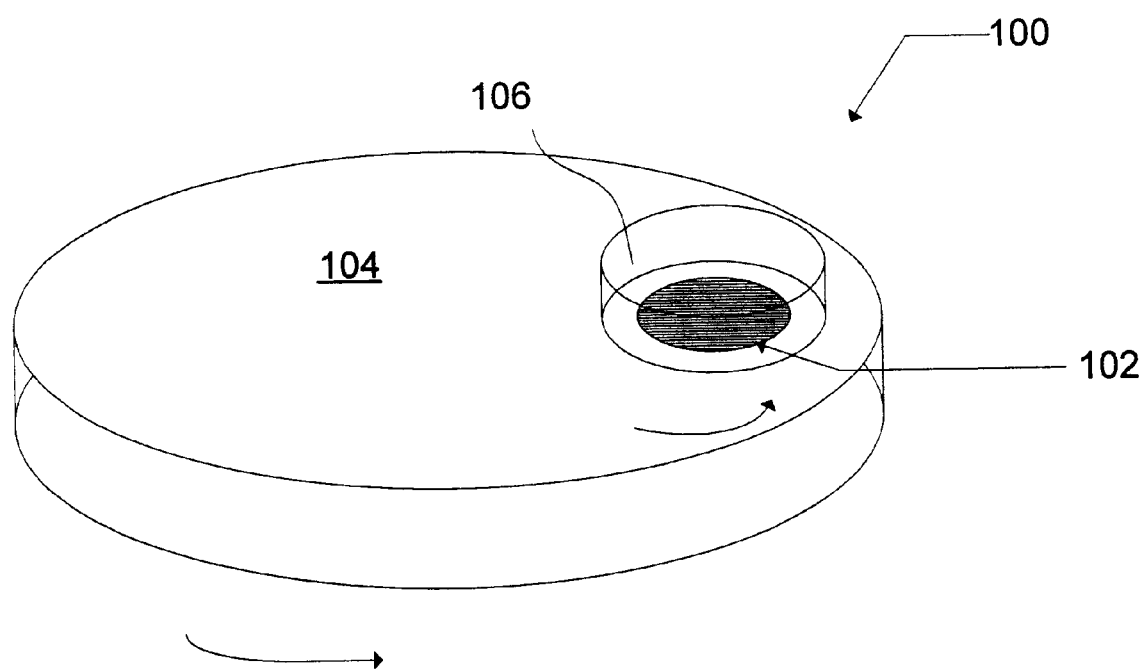
FIG. 1 is a diagrammatic perspective view of a conventional chemical mechanical polishing apparatus

FIG. 1 is a diagrammatic perspective view of a conventional chemical mechanical polishing apparatus 100. The wafer 102 is held positioned against the pad or platen 104 by the polishing head 106. Through the motion of the wafer relative to the polishing pad the polishing of the wafer is accomplished by the abrasive action of the suspended particles relative to the wafer. The removal rate of material from a wafer varies in accordance with a number of different parameters. For example, the removal rate has been shown to be directly proportional to the downward force exerted on the surface that is being polished and inversely proportional to the surface area that comes into contact with the polishing pad. The removal rate of material therefore increases as the downward pressure increases. Other examples of parameters that affect the removal rate include the chemical composition of the slurry and the slurry particle size. Typical CMP polishing slurries are mixtures of oxidizers, corrosion inhibitors, and abrasives.

Typically, as shown, the polishing head 106 rotates in the same direction as the platen 104. However these relative rotational directions as well as the pattern of movement of the wafer 102 relative to the platen 104 may be modified and thus affect the rate of material removal.

As discussed above, with increasing miniaturization of integrated circuits, the trend has been towards incorporating copper interconnect metal layers with low-k dielectric layers in forming the interconnect levels for these circuits. These interconnect layers are typically formed by damascene methods. For example, damascene processing involves etching trenches in insulating layers (such as a low-K layer) in a desired pattern for a wiring layer. These trenches are then filled with conductive material to produce the integrated interconnect wires. Where contact vias, extending downwardly from the bottom of the trenches, are simultaneously filled, the process is known as dual damascene. The fill process for the copper interconnects typically includes a diffusion barrier, a copper seed layer, and the deposition of the bulk copper. The copper interconnect lines are formed by polishing away the field copper, the seed layer, and the diffusion barrier down to the underlying dielectric.

The softer and more porous low-k dielectrics are generally unable to withstand the extreme stresses created by chemical mechanical polishing. Chemical mechanical polishing (CMP) creates problems such as scratching, peeling, and dishing that are exacerbated when performed on interconnects formed from the low-k dielectrics and copper.

The present invention overcomes these problems by incorporating electropolishing in the copper layer removal process. Electropolishing is an electrochemical process which typically removes defects from the surface of a metal part using a combination of rectified current and a chemical electrolyte in which the metal part is immersed. It has been described as a reverse plating process. In particular, the metal part to be polished is connected to a positive voltage to form an anode. Large DC currents flow from the anode to a metal cathode to perform an operation that has been described as the reverse operation of electrochemical deposition. That is, electric fields provide increased metal removal rate over the microscopic peaks of the metal part, resulting in smooth surfaces at efficient removal rates. Metallic parts in a variety of industries have been conventionally electropolished by immersing the parts into electrolytic baths. Attempts to electropolish wafers by spraying electrochemical solutions across the wafer have shown only limited success.

In one embodiment of the present invention, the electropolishing step is performed by applying a voltage or current across the polishing head and the polishing pad and dispensing an electrolytic solution over the pad. In this configuration, the polishing head serves as the anode while the platen serves as the cathode. That is, material is removed from the conductive layer on the substrate which is in electrical contact with the anode. The electrolytic solution is maintained between the anode and the cathode by suitable control of the viscosity of the electrolytic solution (slurry). For example, the viscosity may be controlled by the additive concentration and by temperature control of the slurry.

Figure 2:
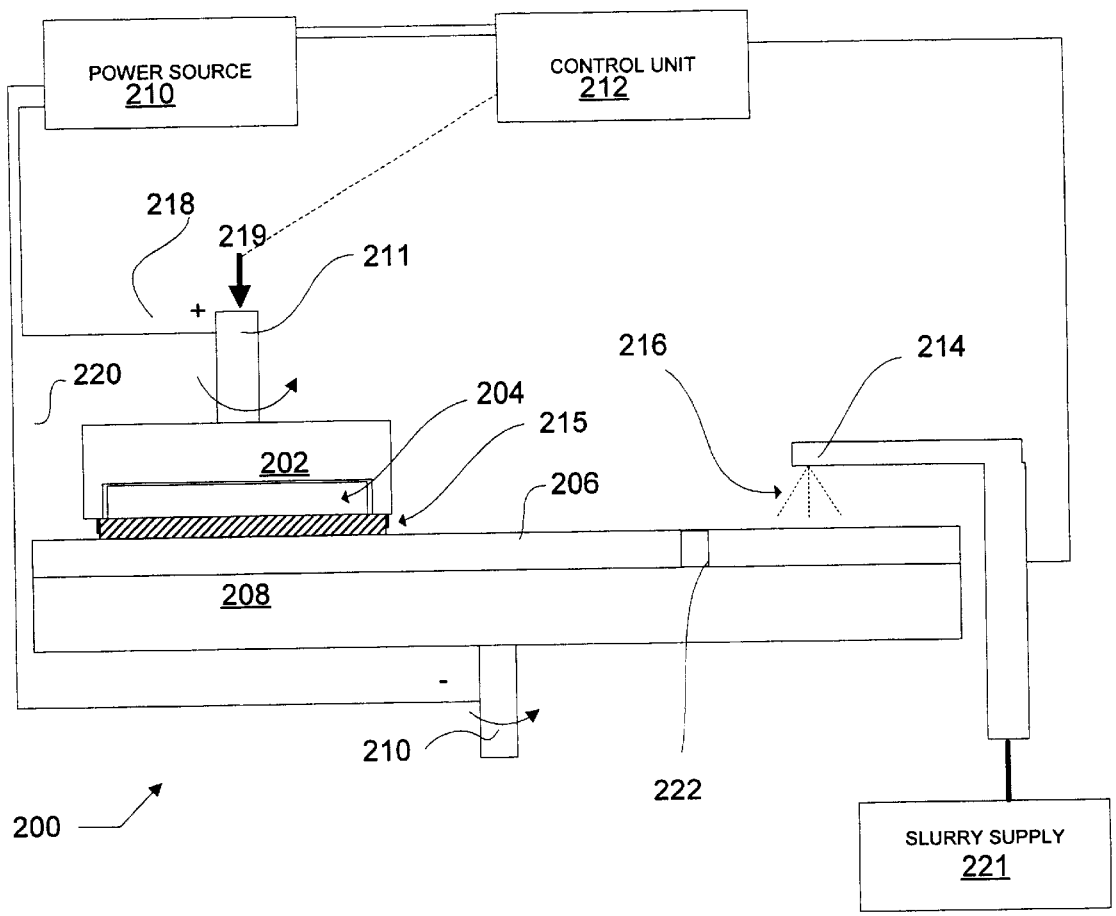
FIG. 2 is a diagram illustrating a chemical mechanical/electropolishing apparatus in accordance with one embodiment of the present invention.

FIG. 2 is a diagram illustrating a chemical mechanical/electropolishing apparatus 200 in accordance with one embodiment of the present invention. The substrate 204 is mounted on the polishing head 202 and rotated, preferably in the same direction of rotation as the platen 208. A polishing pad 206 is disposed on the platen 208 to rotate with the platen 208 and thus to provide relative motion between the substrate 204 and the pad 206. Preferably, the polishing pad 206 is conductive and selected to have a suitable softness to avoid or minimize scratches on a low-k dielectric layer subjected to polishing according to the methods of the present invention. That is, suitable polishing pads are commercially available, for example, including the Rodel IC1000 CMP polyurethane pad available from Rodel Inc. of Phoenix, Ariz. Suitable polishing pads for polishing conductive metals such as copper are often composed of microporous polyurethane materials. For electopolishing, the pore structure works with the electrolytic slurry to provide an electrically conductive path from the anode to the cathode. Materials meeting these requirements are known to those of skill in the art and further description is deemed unnecessary.

In order to perform electropolishing, an electrolytic slurry 216 is dispensed over the polishing pad 206 though a spray arm mechanism 214 or other device. Devices and methods for dispensing slurries are known to those of skill in the art and may be adapted to deliver the electrolytic slurries of the present invention. For example, a spray arm mechanism such as utilized by the MAT Mirra type CMP systems manufactured by Applied Materials, Inc. of Santa Clara, Calif. may be used. Alternatively, the electrolytic slurry may be delivered through the pad, such as, for example, by using a 676/776/MV type polisher as manufactured by SFI/Novellus of Chandler, Ariz.

Using the dispensing apparatuses as described, a barrier layer 215 of electrolytic solution may be formed between the substrate 204 and the polishing pad 206. In order to perform electropolishing, a voltage or current is applied between the polishing head 202 and the platen 208. As illustrated, the voltage or current is provided by the power source 210 with electrical lines 218, 220 providing the voltage or current to the polishing head 202 and platen 208 respectively. In order to perform electropolishing, any of a wide range of voltages may be applied which are process dependant. Voltage differentials between the cathode and the anode in the range of 0.1 v to 100 v are expected to be suitable, although the invention is not so limited. The current range is preferably 0.1 to 35 amps, although the invention is not intended to be limited to this range. Further, the voltage or current is switch controlled. That is, electropolishing may be initiated by switching on the voltage (or current) and supplying a voltage or current in the ranges specified and terminated by switching off the voltage (or current).

A controlled down force 219 is applied to the polishing head 202 to provide some control over the removal rate. A drive mechanism (not shown) provides a driving force for rotation of the polishing head 202 and platen 208 through the polishing head shaft 211 and platen shaft 210 respectively. Further, the polishing head 202 may be moved laterally with respect to the platen 208 to provide the desired relative movement between the surface of the substrate and the polishing pad surface. In accordance with methods known to those of skill in the art of chemical mechanical polishing, the rotation and movement of the polishing head relative to the platen may be controlled to produce a desired uniformity of surface removal. For example, the polishing head may be configured to move in an orbital path across the platen, with both the platen and the polishing head rotating in the same direction. Alternatively, the polishing head provides a rotary motion relative to the platen.

With the arrangement as disclosed, the same electrolytic slurry may be used for electropolishing and chemical mechanical polishing. Thus, the same tool may be used to perform chemical mechanical polishing to facilitate planarization of the wafer surface and electropolishing where the efficiencies provided by electropolishing are suitable.

The removal rate from the chemical mechanical polishing is preferably adjusted by the down force 219 applied to the polishing head shaft 211. By connecting the voltage or current to the polishing head shaft 211 and to the platen shaft 210, the polishing head in electrical contact with the polishing head shaft 211 functions as an anode whereas the platen 208, in electrical contact with the polishing pad 206 and the electrolytic solution 216 dispersed across the pad, serves as a cathode. That is, Cu ions are preferably removed from the substrate surface 204 during electropolishing process steps by applying a voltage or current to the anode and cathode.

Preferably, control unit 212 is configured, according to one embodiment, to determine whether electropolishing, chemical polishing, or a combination of both procedures is applied to the substrate and to control the sequence of steps. Further, the controller is preferably electrically connected to one or more of the power source 210 to initiate and control electropolishing, a pressure mechanism (not shown) to provide down force to the polishing head, the spray arm dispensing mechanism 214, and slurry supply reservoirs 221 to effectuate control of the sequenced steps in the combination electropolishing and chemical mechanical polishing process.

Preferably the system 200 also includes an endpoint detection mechanism 222, for example, to accurately determine the proper time to switch steps in the planarization sequence. For example, optimal performance may be obtained when accurate determinations are made as to the progression from copper field to diffusion barrier removal and from the diffusion barrier to the low-k dielectric. According to one embodiment, optical endpoint detection techniques are used to detect reflectivity changes across the wafer surface. Preferably, the optical endpoint detection mechanism 222 is located within the polishing pad 206 as shown. Suitable endpoint detection means are known to those of skill in the relevant art and thus further descriptive details are deemed unnecessary here.

Preferably, the controller is configured to respond to the various input signals (e.g., including timing signals and signals for endpoint detection) to direct a sequence of polishing steps to efficiently planarize the wafer and to remove the excess copper from the damascene structure. Each of the steps in the process may be solely an electropolishing step, a chemical mechanical polishing step, or a combination of electropolishing and chemical mechanical polishing. That is, the controller may be configured to apply or remove voltage or current from the polishing head and platen to turn on or off the electropolishing. Further, fine control of the electropolishing rate maybe provided by control of the current or voltage applied to the respective cathode and anode. The degree of chemical mechanical polishing may be controlled in part by the down force applied to the polishing head, preferably determined in response to a control signal provided by the controller. The controller may be any processor, general purpose computer, special purpose programmed logic circuit, or general logic circuit configured and capable of responding to sensor signals and generating control signals, in accordance with techniques known to those of skill in the relevant art.

In a preferred embodiment, the temperature and additive concentration of the slurry are selected to achieve a predetermined viscosity in the electrolytic slurry. Preferably this is performed so that the barrier layer 215 is maintained between the substrate 204 and the polishing pad 206. With this configuration, voltages or currents applied to the conductive polishing head and platen are conducted to the metallic (conductive) surface on the substrate through the conductive electrolyte, i.e. the barrier region 215. Further, the discharge rate of the slurry is preferably selected to continually renew the slurry material in the barrier layer and to remove byproducts of CMP and electropolishing steps. The viscosity of the electrolyte should be a suitable value to maintain the anode (substrate) and cathode (platen) continuity. For example, a higher viscosity enables good contact between the anode and cathode. Any conductive chemistry that doesn't attack the film as an etchant is expected to be suitable as an electrolyte. For example, an electrolyte comprising phosphoric acid/glycol is one commercially available product. Other suitable examples are known to those of skill in the art and therefore further description is deemed unnecessary here.

Figure 3:
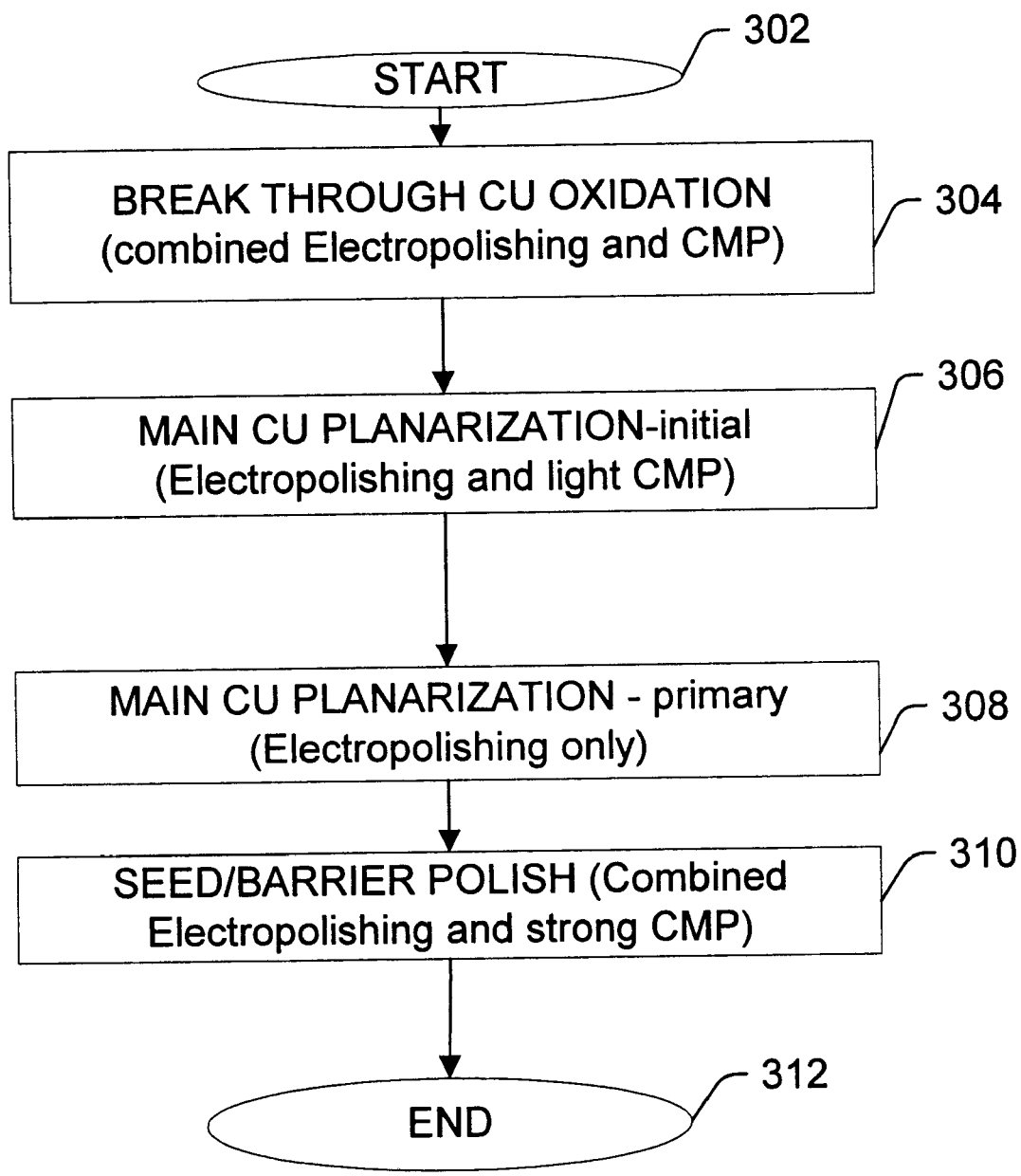
FIG. 3 is a flowchart illustrating a method of polishing a substrate surface in accordance with one embodiment of the present invention.

FIG. 3 is a flowchart illustrating a method of polishing a substrate surface in accordance with one preferred embodiment of the present invention. The polishing process begins at a step 302. Initially, an optional "break through" oxidation removal step 302 may be performed to remove Cu oxidation on the exposed copper surfaces of the damascene structure. Since the efficiency of the copper removal by electrolytic action is reduced by the presence of the oxide, this step preferably comprises a "strong" chemical mechanical polishing step combined with the electropolishing. For example, strong abrasives and a heavier down force may be applied here as compared to subsequent CMP forces during subsequent steps. Preferably, a combination of electropolishing and chemical mechanical polishing is performed. Typically, the copper oxide formation forms a very thin layer on the bulk copper. For example, in a copper interconnect line 4000 to 9000 Angstroms in thickness, the oxide layer may be less than 50 Angstroms. Next, in step 306, an initial planarization of the main (i.e., bulk) copper is performed using electropolishing and light CMP. The primary purpose for this step is planarization. While electropolishing is efficient in removing metals such as copper, it generally performs poorly in achieving a planarized (i.e., flat) surface. As discussed above, the combination of electropolishing and light CMP is preferably performed by using the same electrolytic slurry but initiating electropolishing by applying a voltage or current to the anode and cathode.

Preferably step 306 is performed until the interconnect surface is sufficiently planarized. Next, the primary main copper planarization using electropolishing takes place in step 308. Electropolishing can effectively and efficiently remove the remaining copper layer and maintain the planarity achieved by the preceding steps.

Planarization of damascene structures typically is performed until the copper seed layer (if present) and the barrier metal layer is removed. After the main copper is removed, preferably with the removal threshold determined by endpoint detection means, the seed/barrier polish is performed using a combination electropolishing and strong CMP in step 310. It should be appreciated that the slurries supplied to the polishing pad may be changed to optimize removal rates, depending upon the layer designated for removal and the desired removal rate. For example, after removal of the bulk copper, the slurries may be changes to include abrasive particles tailored for the removal of the barrier metal, while still maintaining the constituency of the slurry to behave as an electrolyte.

According to one embodiment, removal of the barrier is performed until end point detection means determines that the entire barrier metal layer is removed. Preferably, the end point detection means includes an optical or alternatively an electrical end point detector to determine the point at which copper has been removed sufficiently to expose the barrier layer. According to yet another alternative embodiment, endpoint detection means are used to determine both the sufficiency of removal of the copper bulk film and later to determine the sufficiency of removal of the underlying barrier metal film.

Down forces applied to wafers typically vary from about 4 psi to 10 psi for conventional CMP procedures. At 4 psi the down force results in a light polishing, i.e., a hydroplaning of the polishing pad over the wafer. Beyond 10 psi the wafer often faces a substantial risk of breaking or other damage. In one embodiment of the present invention, a preferable range of down forces lies in the range from about 2 psi to 10 psi. With these limits in mind, the term light CMP as used in this specification is intended to refer to down forces on the low end of this range, i.e., 2 to 4 psi whereas the term strong CMP refers to down forces at the high end of this range, i.e., 4 to 10 psi. It will be recognized that an appropriate down force is process dependant, i.e., it depends on the dielectric material, the slurry composition, the slurry temperature and a number of other parameters. Using the guidelines provided by this specification, one skilled in the art would be able to adapt the down force for the various process parameters to efficiently perform the electropolishing and CMP steps as described herein. For example, one skilled in the art would suitably adjust the down force to perform a light CMP, i.e., predominately electropolishing with some CMP polishing performed simultaneously and further to perform a strong CMP when the predominate polishing procedure desired is CMP.

FIGS. 4A–4E are diagrams illustrating stages in the process of planarizing a damascene interconnect structure of a semiconductor integrated circuit in accordance with one embodiment of the present invention. The process commences with a trench 402 and via 404 formed in a low-k dielectric layer 406 according to conventional method, the trench and via filled with a copper conductive material 410 after deposition of a diffusion barrier layer 410 and a seed layer (not shown). As described above, after filling the trench and via with bulk copper, a copper oxide layer 412 may form on the copper from exposure to ambient conditions.

Figure 4A:
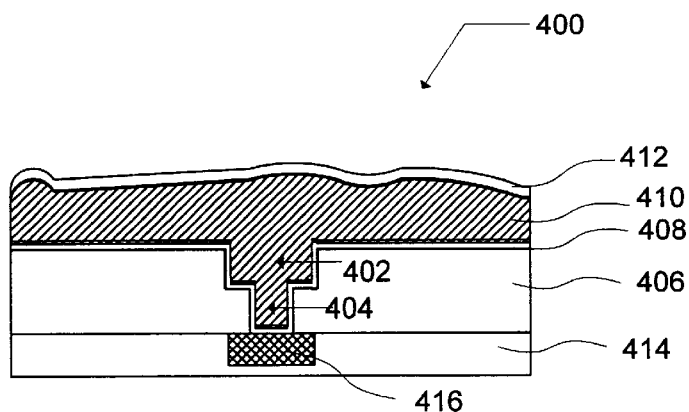
FIGS. 4A–4E are diagrams illustrating stages in the process of planarizing a damascene interconnect structure of a semiconductor integrated circuit in accordance with one embodiment of the present invention.
Figure 4B:
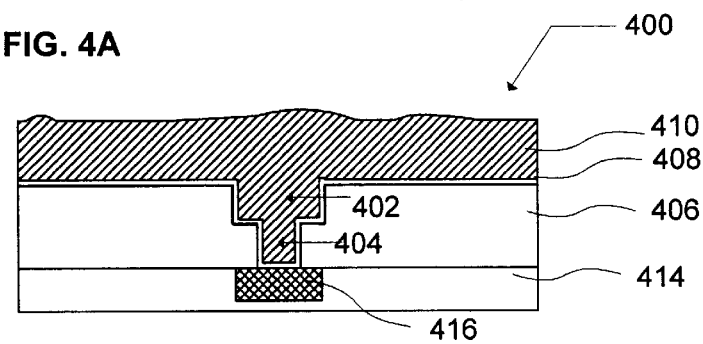
Figure 4C:
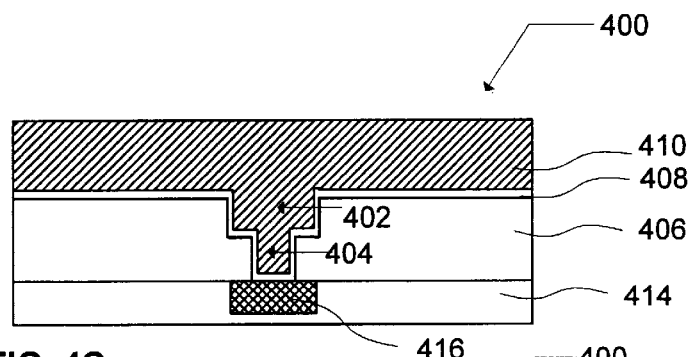

FIG. 4B illustrates the damascene structure 400 after removal of the copper oxide layer 412 by the combination of electropolishing and strong CMP as described above with respect to FIG. 3. It should be noted that the CMP activity is required here due to the ineffectiveness of the electropolishing (EP) in removing the oxide layer, since the oxide is a poor conductor. Electropolishing techniques work poorly or not at all in removing poor conductors. Next, as illustrated in FIG. 4C, the initial main copper planarization provides a flat, uniform surface on top of the damascene structure 400. This is shown after application of electropolishing and light CMP as described above.

Figure 4D:
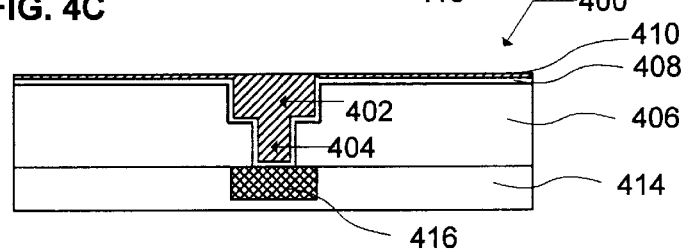

FIG. 4D illustrates the damascene structure after main copper planarization-primary (see step 308) is performed. As shown, the majority of the bulk copper layer 410 is removed, using primarily electropolishing. In a preferred embodiment, the electropolishing is performed in the absence of CMP by suitably adjusting the CMP down force, i.e., to a very low value, for example 0 psi. However, in alternative embodiments, electropolishing in the main copper planarization-primary step may be supplemented with a suitable degree of CMP (e.g., light CMP). Preferably, completion of the step is detected by endpoint detection means, such as, for example, optical endpoint detection means configured to detect reflectivity from the wafer surface. Using such means, the removal of the copper and the detection of the exposure of the barrier layer can be made.

Figure 4E:
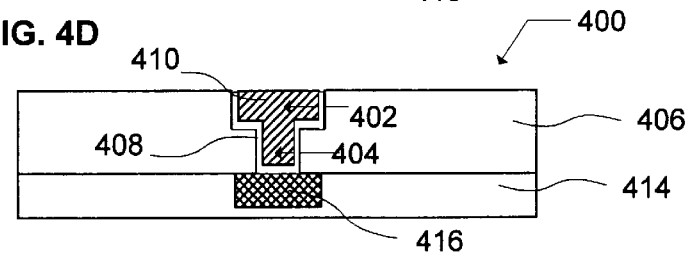

As described above and illustrated in FIG. 3, after the main copper is removed, the seed/barrier polish is performed using a combination electropolishing and strong CMP. FIG. 4E illustrates the finished interconnect structure 400 after removal of any remaining residue of the copper layer 410 outside of the trench 402 and removal of the barrier layer 408 (outside of the trench). The interconnect structure shown is ready for deposition of the next low-k layer.

While the above sequences of electropolishing and CMP steps in combination are preferable, the invention is not so limited. The down forces applied during each step and the presence or absence of either electropolishing or CMP in a step is not specifically limited, but dependant upon the particular layer sought to be removed, the topography of the layer, and whether a high removal rate or fine polishing is desired.

The embodiments of the present invention may be incorporated into one fabrication tool using a common electrolytic slurry or alternatively using different slurries, for example when CMP is performed in the absence of a simultaneous electropolishing process. In a preferred embodiment, the slurries used are electrolytic to enable CMP and EP to be performed simultaneously.

As is known to those of skill in the art, slurry dispensing mechanisms are capable of providing different slurries during the polishing process and the scope of the present invention is intended to cover the changing of slurries during the removal process. Further, the scope of the present invention is intended to cover polishing tools having multiple tables for performing a sequence of polishing operations on separate tables. For example, the Mirra CMP System described above is equipped with three different polishing tables. The sequence of polishing steps described above with reference to FIG. 3 may thus be implemented on such a system by configuring it to direct the wafer sequentially through the polishing tables included in the system. Accordingly, each of the tables may be configured with different combinations of slurries, down forces, voltages or currents to perform the sequence of steps efficiently.

The embodiments of the present invention have generally been described with reference to a copper damascene structure but should not be interpreted as limiting the invention. It should be appreciated that the embodiments of the present invention may be adapted to work with the polishing of different metals, both in damascene structures and in other layers. For example, tungsten may be used to fill vias and aluminum has been shown to be suitable for use in damascene structures. The scope of the present invention is thus intended to cover these and other conductive materials, whether or not used in damascene structures.

The techniques of the present invention provide the capability to polish copper layers on wafers having low-k films without damaging the structure. High removal rates can be achieved by controlling the current and voltage to the wafer while polishing, thus resulting in a stress free or low stress planarization. The polishing system may be constructed by modest modifications to existing hardware such as incorporating a conductive polishing head and polishing pads.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of planarizing a surface on a semiconductor substrate, the method comprising:

forming a conductive layer inlaid in a dielectric layer of the semiconductor substrate;

disposing the semiconductor substrate opposite to a polishing pad and providing relative movement between the pad and the substrate;

flowing a slurry over at least one of the polishing pad and the substrate, wherein the slurry includes an electrolytic solution for electropolishing and abrasive particles for chemical mechanical polishing of the substrate surface;

applying a voltage or current between the polishing pad and the substrate to create electrolytic action in the electrolytic solution and to perform electropolishing of the conductive layer on the substrate; and controlling the removal rate of the surface by adjusting at least one of an adjustable down force applied to the substrate and voltage or current applied between the polishing pad and the substrate, wherein the planarization comprises a sequence of an initial simultaneous electropolishing and light chemical mechanical polishing of the conductive layer, a primary polishing of the conductive layer using electropolishing; and a polishing of at least one of a seed and barrier layer formed prior to the conductive layer using a simultaneous application of electropolishing and chemical mechanical polishing.

2. The method as recited in claim 1 wherein the inlaid conductive layer is copper damascene interconnect structure.

3. The method as recited in claim 1 wherein the inlaid conductive layer is one of a tungsten and aluminum layer.

4. The method as recited in claim 1 wherein the slurry is used for both electropolishing of the substrate and chemical mechanical polishing of the substrate.

5. The method as recited in claim 1 wherein the electropolishing and chemical mechanical polishing of the substrate are performed simultaneously using the slurry.

6. The method as recited in claim 1 wherein the planarizing of the surface is performed in a sequence of steps, initiation and termination of electropolishing occurring thorough the switchable application of the voltage or current between the polishing pad and the substrate.

7. The method as recited in claim 1 wherein the removal rate of electopolishing is controlled by one of the voltage and current applied to the polishing pad and the substrate.

8. The method as recited in claim 1 wherein the wherein the electropolishing and chemical mechanical polishing of the substrate are performed sequentially using the same polishing apparatus.

9. The method as recited in claim 1 wherein the initial simultaneous electropolishing and light chemical mechanical polishing of the conductive layer uses a down force in the range of 2 to 4 psi; and a polishing of at least one of the seed and barrier layer uses a down force of 4 to 10 psi.

10. The method as recited in claim 9 further comprising removing an oxide layer disposed on the copper layer using simultaneous application of chemical mechanical polishing and electropolishing.

11. The method as recited in claim 1 wherein the slurry is introduced to the polishing pad using a spray arm mechanism disposed over the substrate.

12. The method as recited in claim 1 wherein the slurry is introduced to the substrate by a dispensing mechanism located in the polishing pad.

13. The method as recited in claim 1 wherein an endpoint detector is used to determine completion of the conductive metal removal from the surface of the semiconductor substrate.

14. The method as recited in claim 1 wherein the polishing pad is a conductive when exposed to a conductive electrolyte.

15. The method as recited in claim 1 wherein the removal rate in electropolishing is controlled by adjusting at least one of the current and voltage applied to the substrate and the platen and the removal rate of the chemical mechanical polishing is controlled by the down force applied to the polishing head.

16. A polishing apparatus for performing electropolishing and chemical mechanical polishing of a semiconductor substrate, the polishing apparatus comprising:

a polishing pad located on a rotating platen;

a polishing head for urging a substrate against the polishing pad;

one of a current or a voltage source for application of a differential voltage or a current between the polishing head and the polishing pad;

a slurry dispensing mechanism for dispensing an electrolytic slurry on the polishing pad, wherein the polishing pad and polishing head are configured to create and maintain a barrier layer between the polishing pad and the substrate for electropolishing of a surface of the substrate, and wherein the removal rate of the surface in electropolishing is controlled by adjusting the current or voltage applied to the substrate and the platen and the removal rate of the surface by the chemical mechanical polishing is controlled by adjusting the down force applied to the polishing head; and a control unit configured to perform an initial simultaneous electropolishing and light chemical mechanical polishing of a conductive layer on the substrate, followed by a primary polishing of the conductiver layer comprising electropolishing, followed by a polishing of at least one of the seed and barrier layer using a simultaneous application of electropolishing and chemical mechanical polishing.

17. The apparatus as recited in claim 16 wherein the initial simultaneous electropolishing and light chemical mechanical polishing uses a down force in the range of 2to 4psi; and wherein the polishing of at least one of the seed and barrier layer uses a down force of 4 to 10 psi.

18. The apparatus as recited in claim 17 wherein the control unit is further configured to control initiation and termination of electropolishing thorough the switchable application of the voltage or current between the polishing pad and the substrate.

19. The apparatus as recited in claim 16 further comprising an endpoint detector to determine completion of removal of the conductive layer from the substrate.

20. The apparatus as recited in claim 16 wherein the relative contributions of electropolishing and chemical mechanical polishing to the removal rate of the surface are determined by adjusting both the down force and the voltage or current applied.

* * * * *